United States Patent
Steiner et al.

(10) Patent No.: US 8,072,071 B2
(45) Date of Patent: Dec. 6, 2011

(54) SEMICONDUCTOR DEVICE INCLUDING CONDUCTIVE ELEMENT

(75) Inventors: Rainer Steiner, Regensburg (DE); Jens Pohl, Bernhardswald (DE); Werner Robl, Regensburg (DE); Markus Brunnbauer, Lappersdorf (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 40 days.

(21) Appl. No.: 12/389,103

(22) Filed: Feb. 19, 2009

(65) Prior Publication Data

US 2010/0207272 A1 Aug. 19, 2010

(51) Int. Cl.
*H01L 23/498* (2006.01)
(52) U.S. Cl. .......... 257/738; 257/E23.069; 257/E21.576
(58) Field of Classification Search .................. 257/786, 257/778, 781
See application file for complete search history.

(56) References Cited

U.S. PATENT DOCUMENTS

| | | | |
|---|---|---|---|
| 5,355,016 A * | 10/1994 | Swirbel et al. | 257/659 |
| 6,222,270 B1 * | 4/2001 | Lee | 257/758 |
| 6,417,575 B2 * | 7/2002 | Harada et al. | 257/758 |
| 6,448,650 B1 * | 9/2002 | Saran et al. | 257/758 |
| 6,486,563 B1 | 11/2002 | Lin | |
| 6,885,098 B2 | 4/2005 | Weekly | |
| 7,399,661 B2 | 7/2008 | Hiner et al. | |
| 7,420,274 B2 | 9/2008 | Huang | |
| 7,470,988 B2 * | 12/2008 | Lin et al. | 257/759 |
| 2008/0265408 A1 | 10/2008 | Kaufmann et al. | |

OTHER PUBLICATIONS

"An Embedded Device Technology Based on a Molded Reconfigured Wafer", M. Brunnbauer, et al., IEEE, 2006 (5 pgs.).

* cited by examiner

*Primary Examiner* — Leonardo Andujar
(74) *Attorney, Agent, or Firm* — Dicke, Billig & Czaja, PLLC

(57) ABSTRACT

A semiconductor device includes a chip comprising a contact element, a structured dielectric layer over the chip, and a conductive element coupled to the contact element. The conductive element comprises a first portion embedded in the structured dielectric layer, a second portion at least partially spaced apart from the first portion and embedded in the structured dielectric layer, and a third portion contacting a top of the structured dielectric layer and extending at least vertically over the first portion and the second portion.

21 Claims, 12 Drawing Sheets

SEMICONDUCTOR DEVICE INCLUDING CONDUCTIVE ELEMENT

BACKGROUND

Typical semiconductor devices include metal conductors or traces and vias for electrically coupling portions of the semiconductor devices. One method for creating these metal conductors uses a damascene fill process. The process includes forming fine pitch lines by laser structuring a dielectric layer, overfilling the structured dielectric layer by a copper electroplating process, and back etching the excess copper to expose the structured dielectric layer and the trace structures.

This damascene fill process requires a uniform, planar copper plating process. As such, the deposited copper layer must be very flat and uniform to enable etchback and singulation of the metal traces. The uniform deposition process, however, only works for very fine structures. Due to the electroplating process characteristics with copper deposition on the sidewalls of the fine structures, the copper growth is such that the copper surface above the fine structures is almost flat. This does not work for larger structures, however, therefore a dent is visible in the area of larger structures. When the copper is etched back to expose the underlying structures, the copper in the large structures will be etched out completely. Therefore, this process is not capable of creating relatively large structure elements, such as land pads for solder balls.

For these and other reasons, there is a need for the present invention.

SUMMARY

One embodiment provides a semiconductor device. The semiconductor device includes a chip comprising a contact element, a structured dielectric layer over the chip, and a conductive element coupled to the contact element. The conductive element comprises a first portion embedded in the structured dielectric layer, a second portion at least partially spaced apart from the first portion and embedded in the structured dielectric layer, and a third portion contacting a top of the structured dielectric layer and extending at least vertically over the first portion and the second portion.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
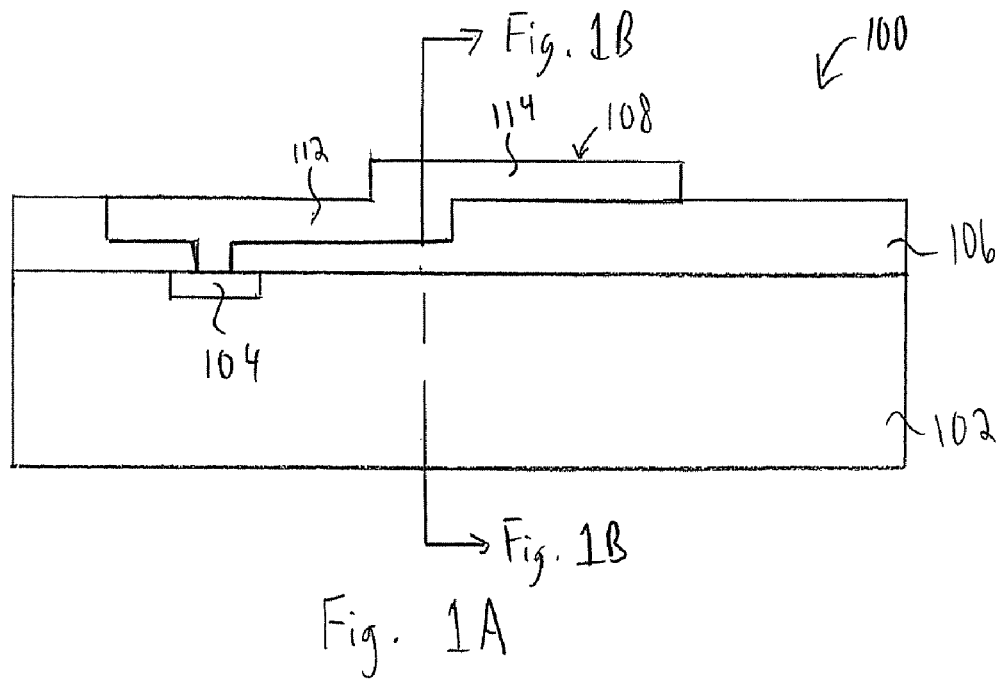
FIG. 1A illustrates a cross-sectional view of one embodiment of a semiconductor device.
Figure 1B:
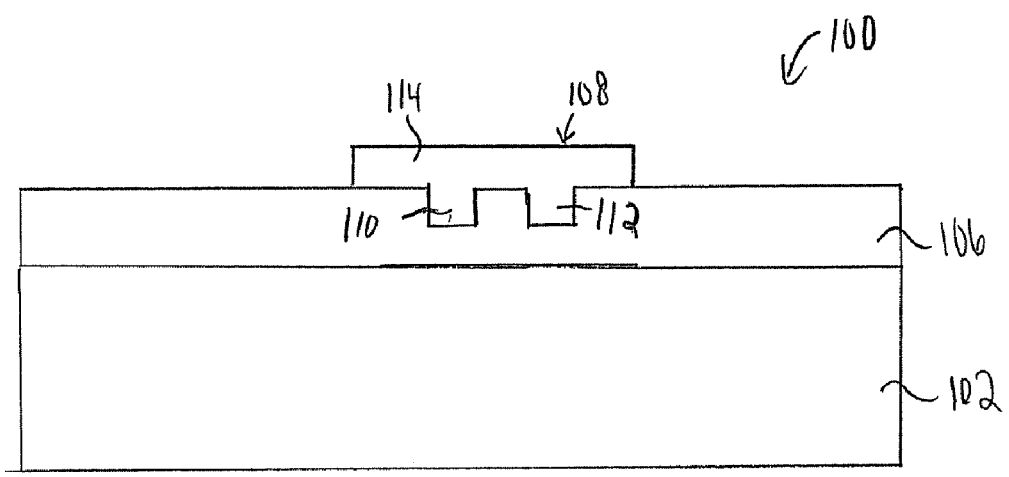
FIG. 1B illustrates a cross-sectional view of one embodiment of the semiconductor device perpendicular to the view illustrated in FIG. 1A.

FIG. 1A illustrates a cross-sectional view of one embodiment of a semiconductor device 100. FIG. 1B illustrates a cross-sectional view of one embodiment of semiconductor device 100 perpendicular to the view illustrated in FIG. 1A. Semiconductor device 100 includes a semiconductor chip 102, a structured dielectric layer 106, and a conductive element 108. Chip 102 includes a contact element 104. Contact element 104 is electrically coupled to conductive element 108.

Chip 102 includes a silicon chip or another suitable chip. The top of chip 102 contacts the bottom of structured dielectric layer 106. In one embodiment, structured dielectric layer 106 includes an oxide or nitride, such as SiO₂ or SiN. Structured dielectric layer 106 defines an opening exposing at least a portion of contact element 104. Conductive element 108 contacts contact element 104 and fills the opening defined by structured dielectric layer 106. In addition, a portion of conductive element 108 contacts the top of structured dielectric layer 106. Conductive element 108 includes copper or another suitable conductive material.

In one embodiment, conductive element 108 includes a first portion 110, a second portion 112, and a third portion 114. First portion 110 of conductive element 108 is embedded in structured dielectric layer 106. Second portion 112 of conductive element 108 is spaced apart from first portion 110 and is also embedded in structured dielectric layer 106. Third portion 114 of conductive element 108 contacts the top of structured dielectric layer 106 and extends over first portion 110 and second portion 112. In one embodiment, first portion 110 and second portion 112 are parallel lines. In another embodiment, first portion 110 and second portion 112 are intersecting lines.

First portion 110 and second portion 112 of conductive element 108 are relatively small structures while third portion 114 of conductive element 108 is a relatively large structure. First portion 110 and second portion 112 improve the adhesion of conductive element 108 to structured dielectric layer 106. Therefore, the reliability of semiconductor device 100 is enhanced. In addition, by providing the relatively large third portion 114 of conductive element 108 over structured dielectric layer 106, the distance between third portion 114 and the active surface of chip 102 is increased. Thus, coupling effects such as electrical parasitics are reduced between conductive element 108 and chip 102.

The following FIGS. 2-7 illustrate one embodiment of a method for fabricating a semiconductor device including a conductive element, such as semiconductor device 100 previously described and illustrated with reference to FIGS. 1A and 1B.

Figure 2:
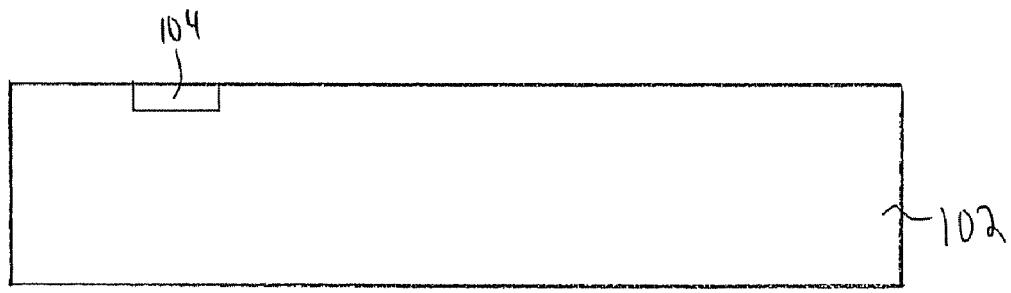
FIG. 2 illustrates a cross-sectional view of one embodiment of a chip.

FIG. 2 illustrates a cross-sectional view of one embodiment of a chip 102. Chip 102 includes a contact element 104. Chip 102 is a silicon chip or another suitable semiconductor chip. Contact element 104 is electrically coupled to circuit elements within chip 102. In one embodiment, contact element 104 includes copper or another suitable conductive material.

Figure 3:
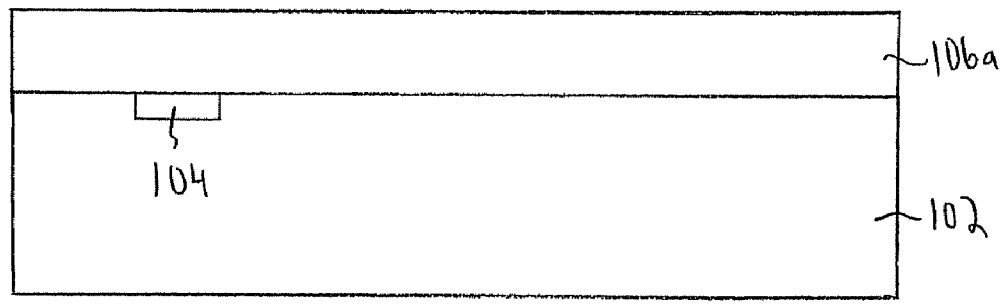
FIG. 3 illustrates a cross-sectional view of one embodiment of the chip and a dielectric layer.

FIG. 3 illustrates a cross-sectional view of one embodiment of chip 102 and a dielectric layer 106a. A dielectric material, such as an inorganic material (e.g., SiO₂ or SiN), an organic material (e.g., polyimide or polybenzoxazole), or another suitable dielectric material is deposited over chip 102 to provide dielectric layer 106a. Dielectric layer 106a is deposited using chemical vapor deposition (CVD), low pressure chemical vapor deposition (LPCVD), high density plasma-chemical vapor deposition (HDP-CVD), atomic layer deposition (ALD), metal organic chemical vapor deposition (MOCVD), physical vapor deposition (PVD), jet vapor deposition (JVD), spin on, or other suitable deposition technique.

Figure 4:
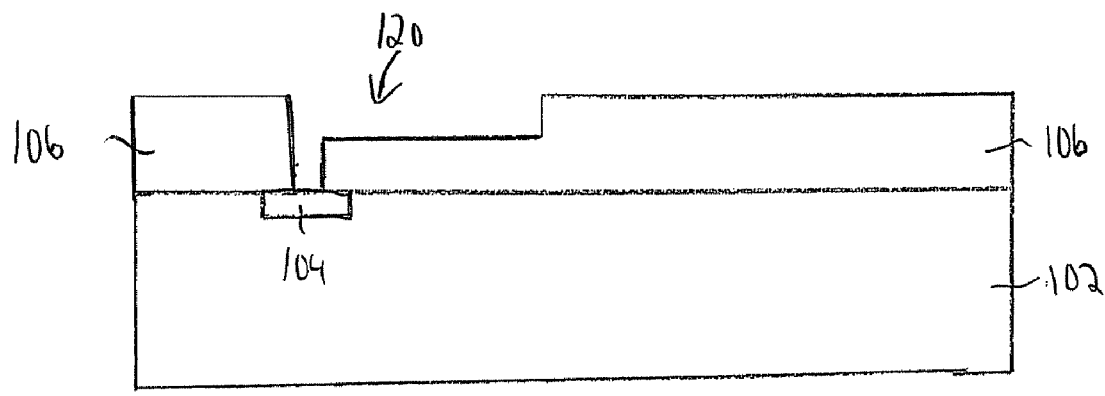
FIG. 4 illustrates a cross-sectional view of one embodiment of the chip and a structured dielectric layer.

FIG. 4 illustrates a cross-sectional view of one embodiment of chip 102 and a structured dielectric layer 106. Portions of dielectric layer 106a are removed to provide opening 120 exposing at least a portion of contact element 104 to provide structured dielectric layer 106. Dielectric layer 106a is structured using a laser, photolithography, imprinting, or another suitable technique to provide structured dielectric layer 106.

Figure 5:
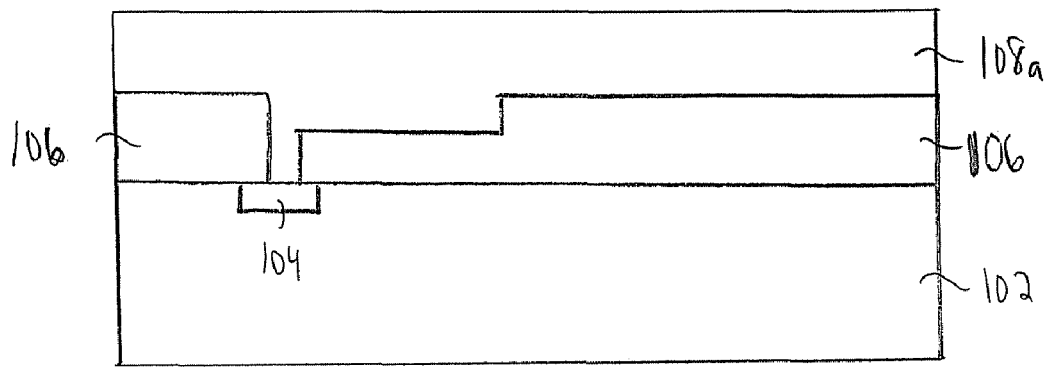
FIG. 5 illustrates a cross-sectional view of one embodiment of the chip, the structured dielectric layer, and a conductive layer.

FIG. 5 illustrates a cross-sectional view of one embodiment of chip 102, structured dielectric layer 106, and a conductive layer 108a. A conductive material, such as copper or another suitable conductive material is deposited over exposed portions of contact element 104 and structured dielectric layer 106 to provide conductive layer 108a. Conductive layer 108a is deposited via electroplating or another suitable deposition technique.

Figure 6:
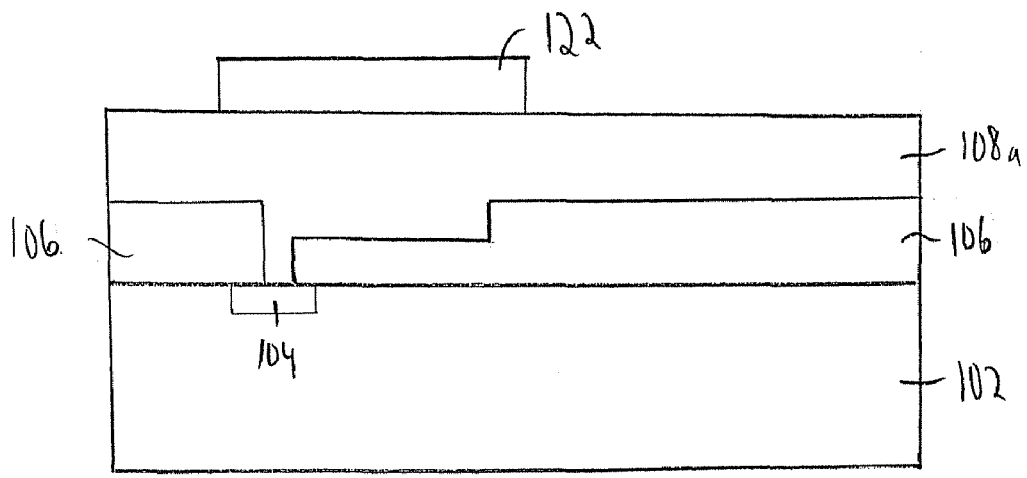
FIG. 6 illustrates a cross-sectional view of one embodiment of the chip, the structured dielectric layer, the conductive layer, and a mask.

FIG. 6 illustrates a cross-sectional view of one embodiment of chip 102, structured dielectric layer 106, conductive layer 108a, and a mask 122. Mask 122 is provided over a portion of conductive layer 108a. Mask 122 includes a spin on or dry film resist or another suitable mask material. In one embodiment, mask 122 is formed by applying a layer of resist over conductive layer 108a using spray on or spin on and then patterning and etching the resist to provide mask 122. In another embodiment, mask 122 is printed on conductive layer 108a. In other embodiments, another suitable process is used to provide mask 122.

Figure 7:
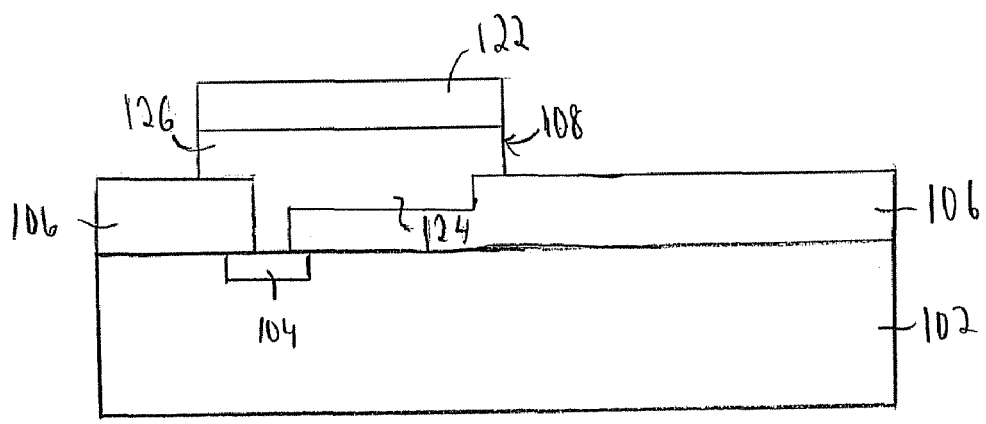
FIG. 7 illustrates a cross-sectional view of one embodiment of the chip, the structured dielectric layer, the mask, and a conductive element.

FIG. 7 illustrates a cross-sectional view of one embodiment of chip 102, structured dielectric layer 106, mask 122, and a conductive element 108. The exposed portions of conductive layer 108a are back etched to expose portions of the top of structured dielectric layer 106 to provide conductive element 108. Conductive element 108 contacts contact element 104 and includes a first portion 124 and a second portion 126. First portion 124 of conductive element 108 is embedded in structured dielectric layer 106. Second portion 126 of conductive element 108 contacts a portion of the top of dielectric layer 106 and extends over first portion 124.

Figure 8:
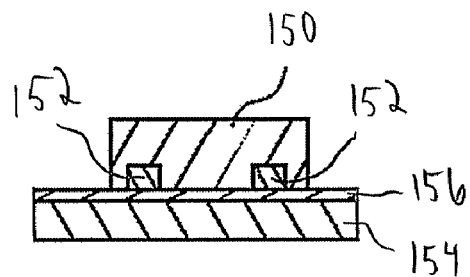
FIG. 8 illustrates a cross-sectional view of one embodiment of a chip attached to a carrier.
Figure 9:
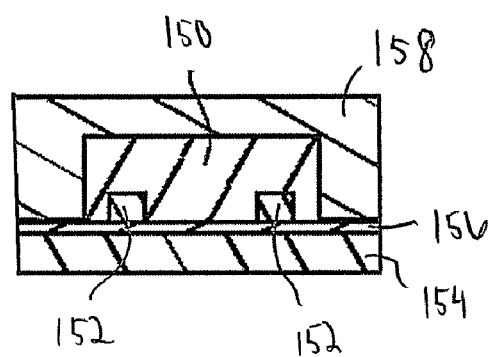
FIG. 9 illustrates a cross-sectional view of one embodiment of the chip attached to the carrier and encapsulation material.
Figure 10:
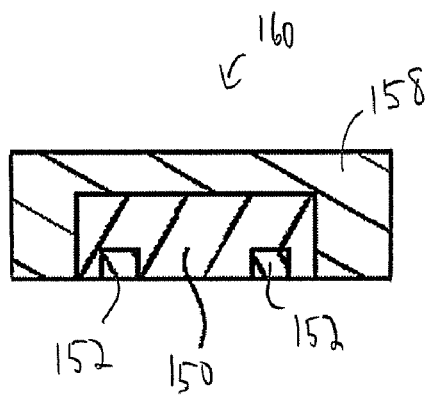
FIG. 10 illustrates a cross-sectional view of one embodiment of an embedded chip.

The following FIGS. 8-10 illustrate one embodiment of a method for fabricating an embedded chip, which can be used in place of chip 102 previously described and illustrated with reference to FIGS. 1A and 1B.

FIG. 8 illustrates a cross-sectional view of one embodiment of a chip 150 attached to a carrier 154. Carrier 154 includes a metal, a polymer, silicon, or another suitable material. A double-sided, releasable, adhesive foil 156 is laminated to carrier 154 or applied to carrier 154 using another suitable technique. In other embodiments, other suitable adhesives are used in place of double-sided adhesive foil 156. Semiconductor chip or die 150 is placed on double-sided adhesive foil 156 with contact elements 152 facing carrier 154. Semiconductor chip 150 is placed on double-sided adhesive foil 156 using pick and place equipment or another suitable process. While one chip 150 is shown attached to carrier 154 in the illustrated embodiment, in other embodiments, a plurality of chips 150 are attached to carrier 154 and processed simultaneously. In other embodiments, chip 150 is replaced with a suitable semiconductor device, such as a passive or active device, a microelectromechanical systems (MEMS) device, an opto-electrical device, a chip stack, a multichip device, etc.

FIG. 9 illustrates a cross-sectional view of one embodiment of chip 150 attached to carrier 154 and encapsulation material 158. In one embodiment, chip 150 and carrier 154 are inserted into a molding tool. An encapsulation material is then applied over chip 150 and carrier 154 and molded to provide encapsulation material 158. In other embodiments, another suitable process is used to provide encapsulation material 158 encapsulating chip 150.

FIG. 10 illustrates a cross-sectional view of one embodiment of an embedded chip 160. Carrier 154 and double-sided adhesive foil 156 are released from semiconductor chip 150 and encapsulation material 158 to provide embedded chip 160. Contact elements 152 of chip 152 are exposed where double-sided adhesive foil 156 was previously attached. In other embodiments, embedded chip 160 is fabricated using another suitable process.

The following FIGS. 11-19 illustrate one embodiment of a method for fabricating a semiconductor device including an embedded device and a conductive element.

Figure 11:
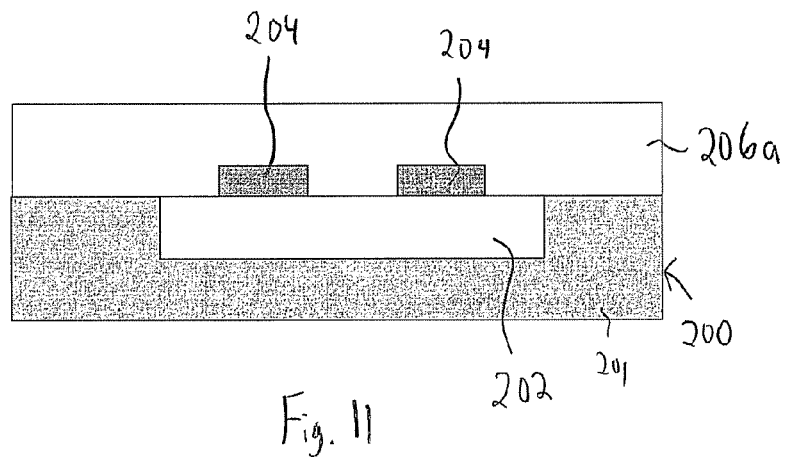
FIG. 11 illustrates a cross-sectional view of one embodiment of an embedded device and a first dielectric layer.

FIG. 11 illustrates a cross-sectional view of one embodiment of an embedded device 200 and a first dielectric layer 206a. In one embodiment, embedded device 200 is fabricated similarly to embedded chip 160 as previously described and illustrated with reference to FIGS. 8-10. Embedded device 200 includes encapsulation material 201, chip 202, and contact elements 204. In one embodiment, contact elements 204 include copper posts.

A dielectric material, such as an inorganic material (e.g., $SiO_2$ or SiN), an organic material (e.g., polyimide or polybenzoxazole), or another suitable dielectric material is deposited over embedded device 200 to provide first dielectric layer 206a. First dielectric layer 206a is deposited using CVD, LPCVD, HDP-CVD, ALD, MOCVD, PVD, JVD, spin on, spray on, lamination, printing, or other suitable deposition technique.

Figure 12:
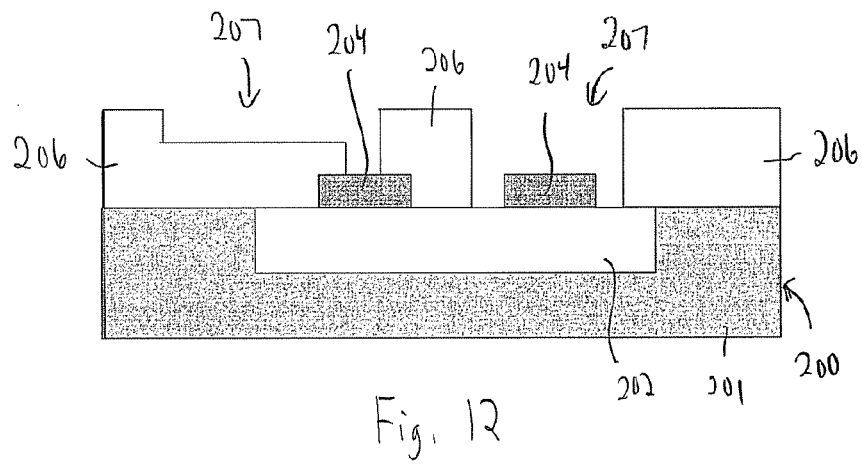
FIG. 12 illustrates a cross-sectional view of one embodiment of the embedded device and a structured first dielectric layer.

FIG. 12 illustrates a cross-sectional view of one embodiment of embedded device 200 and a structured first dielectric layer 206. Portions of first dielectric layer 206a are etched to provide openings 207 exposing at least a portion of contact elements 204 to provide structured first dielectric layer 206. First dielectric layer 206a is structured using a laser, photolithography, imprinting, or another suitable technique to provide structured first dielectric layer 206.

Figure 13A:
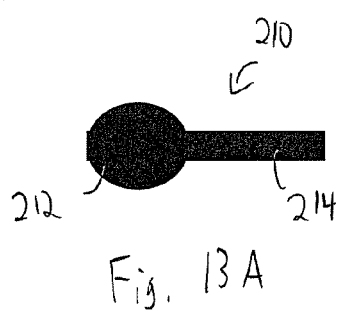
FIG. 13A illustrates a top view of one embodiment of a conductive element.

FIG. 13A illustrates a top view of one embodiment of a conductive element 210. Conductive element 210 includes a trace portion 214 and a land pad portion 212. In one embodiment, structured dielectric layer 206 previously described and illustrated with reference to FIG. 12 defines an opening 207 for a conductive element 210 or a portion 214 of conductive element 210.

Figure 13B:
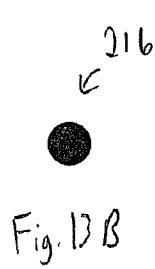
FIG. 13B illustrates a top view of another embodiment of a conductive element.

FIG. 13B illustrates a top view of another embodiment of a conductive element 216. Conductive element 216 is a via. In one embodiment, structured dielectric layer 206 previously described and illustrated with reference to FIG. 12 defines an opening 207 for a conductive element 216 or a portion of conductive element 216.

Figure 13C:
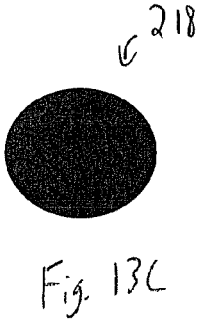
FIG. 13C illustrates a top view of another embodiment of a conductive element.

FIG. 13C illustrates a top view of another embodiment of a conductive element 218. Conductive element 218 is an alignment feature. In one embodiment, structured dielectric layer 206 previously described and illustrated with reference to FIG. 12 defines an opening 207 for a conductive element 218 or a portion of conductive element 218.

Figure 13D:
FIG. 13D illustrates a top view of another embodiment of a conductive element.

FIG. 13D illustrates a top view of another embodiment of a conductive element 220. Conductive element 220 is a solder ball pad. In one embodiment, structured dielectric layer 206 previously described and illustrated with reference to FIG. 12 defines an opening 207 for a conductive element 220 or a portion of conductive element 220.

Figure 14:
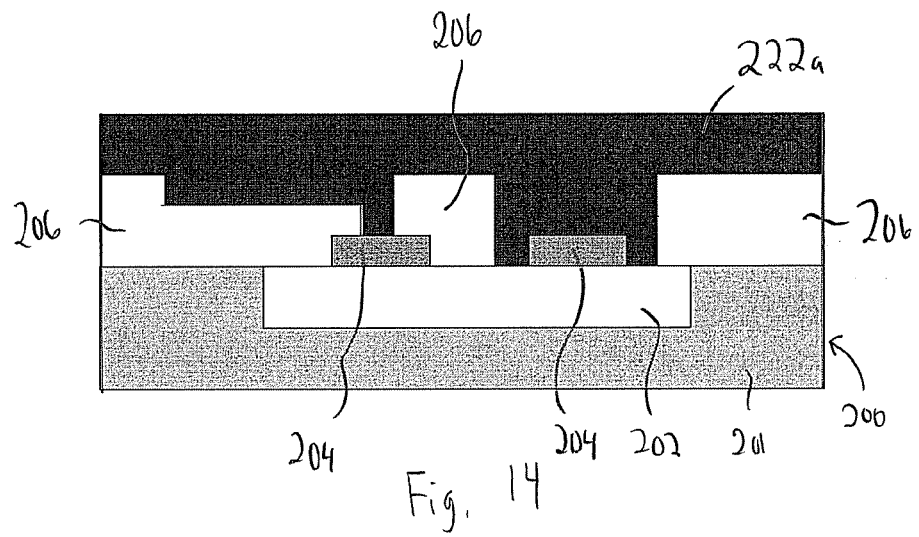
FIG. 14 illustrates a cross-sectional view of one embodiment of the embedded device, the structured first dielectric layer, and a first conductive layer.

FIG. 14 illustrates a cross-sectional view of one embodiment of embedded device 200, structured first dielectric layer 206, and a first conductive layer 222a. A conductive material, such as copper or another suitable conductive material is deposited over exposed portions of chip 202, contact elements 204, and structured first dielectric layer 206 to provide conductive layer 222a. Conductive layer 222a is deposited via electroplating or another suitable deposition technique.

Figure 15:
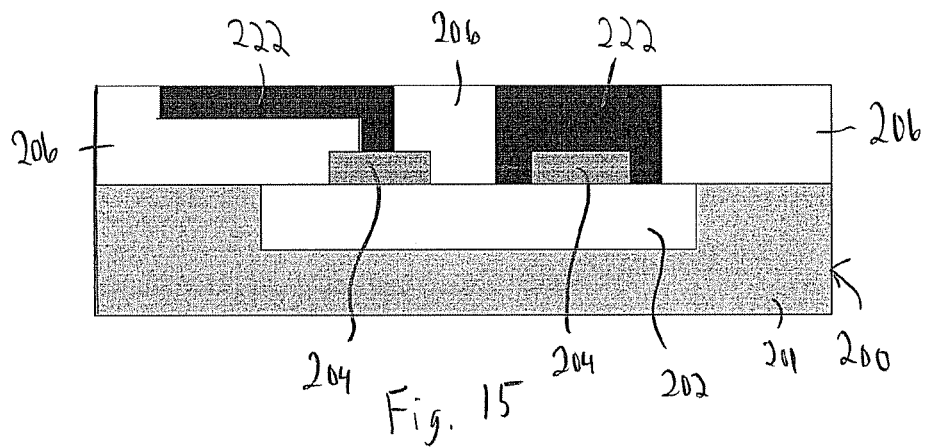
FIG. 15 illustrates a cross-sectional view of one embodiment of the embedded device, the structured first dielectric layer, and first conductive elements.

FIG. 15 illustrates a cross-sectional view of one embodiment of embedded device 200, structured first dielectric layer 206, and first conductive elements 222. Conductive layer 222a is back etched to expose the top of structured first dielectric layer 206 to provide conductive elements 222. In one embodiment, each conductive element 222 contacts a contact element 204.

Figure 16:
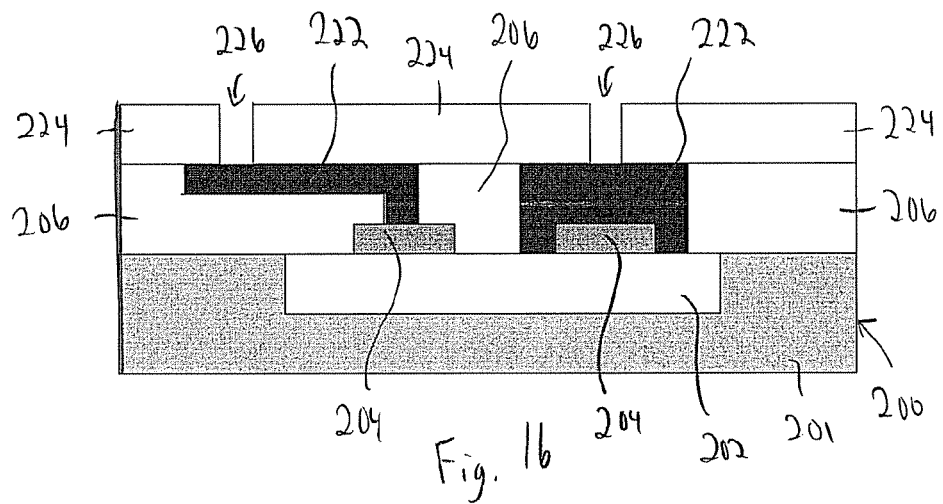
FIG. 16 illustrates a cross-sectional view of one embodiment of the embedded device, the structured first dielectric layer, the first conductive elements, and a structured second dielectric layer.

FIG. 16 illustrates a cross-sectional view of one embodiment of embedded device 200, structured first dielectric layer 206, first conductive elements 222, and a structured second dielectric layer 224. A dielectric material, such as an inorganic material (e.g., $SiO_2$, SiN), an organic material (e.g., polyimide or polybenzoxazole), or another suitable dielectric material is deposited over exposed portions of conductive elements 222 and structured first dielectric layer 206 to provide a second dielectric layer. The second dielectric layer is deposited using CVD, LPCVD, HDP-CVD, ALD, MOCVD, PVD, JVD, spin on, spray on, lamination, printing, or other suitable deposition technique. Portions of the second dielectric layer are then etched to provide openings 226 exposing a portion of first conductive elements 222 to provide structured second dielectric layer 224. The second dielectric layer is structured using a laser, photolithography, imprinting, or another suitable technique to provide structured second dielectric layer 224.

Figure 17:
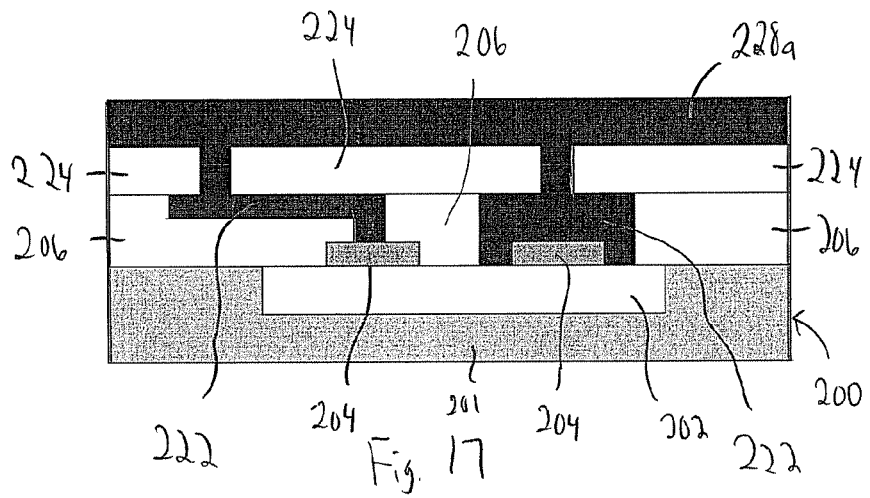
FIG. 17 illustrates a cross-sectional view of one embodiment of the embedded device, the structured first dielectric layer, the first conductive elements, the structured second dielectric layer, and a second conductive layer.

FIG. 17 illustrates a cross-sectional view of one embodiment of embedded device 200, structured first dielectric layer 206, first conductive elements 222, structured second dielectric layer 224, and a second conductive layer 228a. A conductive material, such as copper or another suitable conductive material is deposited over exposed portions of first conductive elements 222 and structured second dielectric layer 224 to provide second conductive layer 228a. Second conductive layer 228a is deposited via electroplating or another suitable deposition technique.

Figure 18:
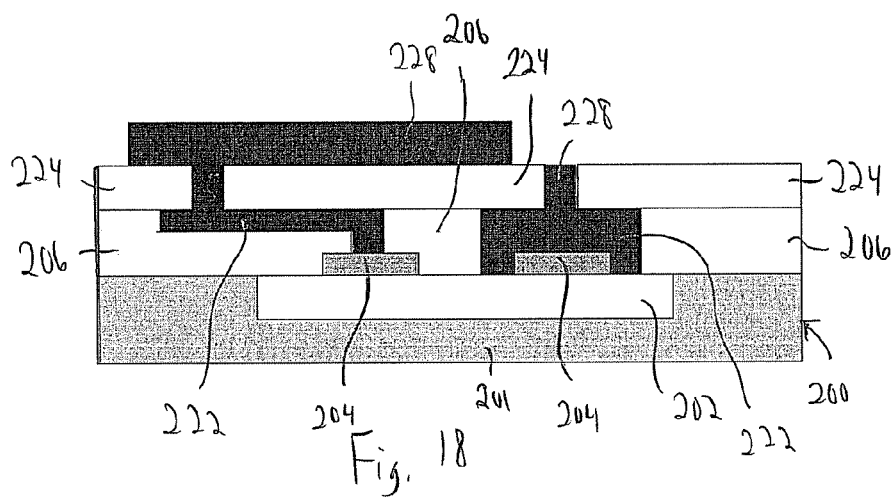
FIG. 18 illustrates a cross-sectional view of one embodiment of the embedded device, the structured first dielectric layer, the first conductive elements, the structured second dielectric layer, and second conductive elements.

FIG. 18 illustrates a cross-sectional view of one embodiment of embedded device 200, structured first dielectric layer 206, first conductive elements 222, structured second dielectric layer 224, and second conductive elements 228. A portion of second conductive layer 228a is masked. The exposed portions of second conductive layer 228a are then back etched to expose portions of the top of structured second dielectric layer 224 to provide second conductive elements 228. Second conductive elements 228 each contact a first conductive element 222. The masked portions of second conductive layer 228a provide a second conductive element including a first portion and a second portion. The first portion of the second conductive element 228 is embedded in structured second dielectric layer 224 while the second portion of the second conductive element 228 contacts the top of structured second dielectric layer 224 and extends over the first portion.

Figure 19:
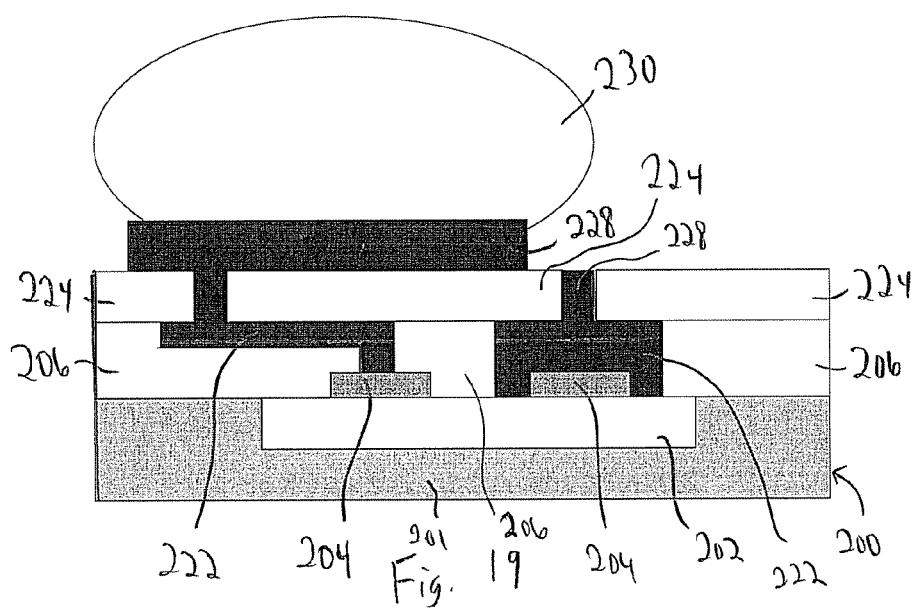
FIG. 19 illustrates a cross-sectional view of one embodiment of the embedded device, the structured first dielectric layer, the first conductive elements, the structured second dielectric layer, the second conductive elements, and an external contact element.

FIG. 19 illustrates a cross-sectional view of one embodiment of embedded device 200, structured first dielectric layer 206, first conductive elements 222, structured second dielectric layer 224, second conductive elements 228, and an external contact element 230. An external contact element, such as a solder ball or another suitable external contact element is attached to a second conductive element 228.

The following FIGS. 20-23 illustrate another embodiment of a method for fabricating a semiconductor device including an embedded device and a conductive element. To begin, a process similar to the process previously described and illustrated with reference to FIGS. 11 and 12 is first performed to provide an embedded device and a structured dielectric layer over the embedded device.

Figure 20:
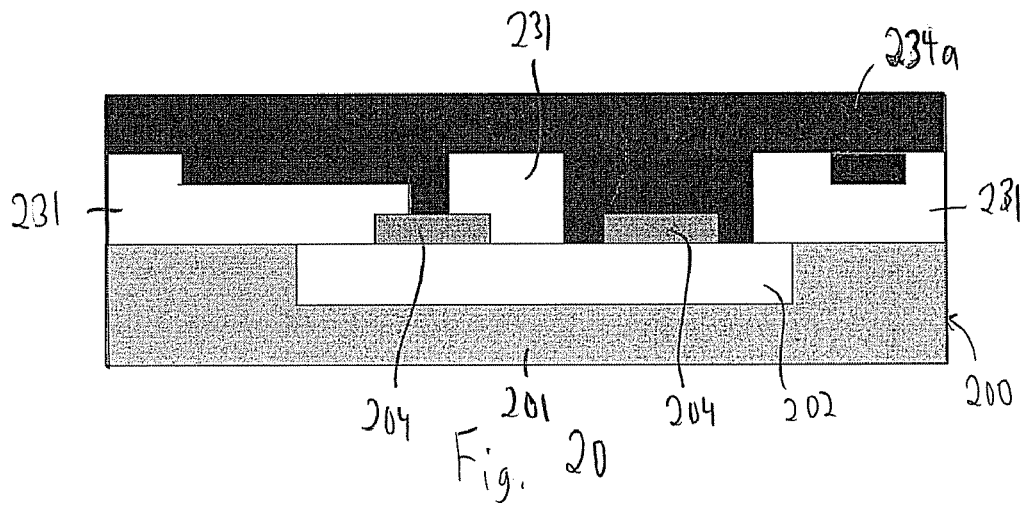
FIG. 20 illustrates a cross-sectional view of one embodiment of the embedded device, the structured dielectric layer, and a conductive layer.

FIG. 20 illustrates a cross-sectional view of one embodiment of embedded device 200, structured dielectric layer 231, and a conductive layer 234a. In this embodiment, structured dielectric layer 231 defines at least one opening that exposes a contact element 204. A conductive material, such as copper or another suitable conductive material is deposited over exposed portions of chip 202, contact elements 204, and structured dielectric layer 231 to provide conductive layer 234a. Conductive layer 234a is deposited via electroplating or another suitable deposition technique.

Figure 21:
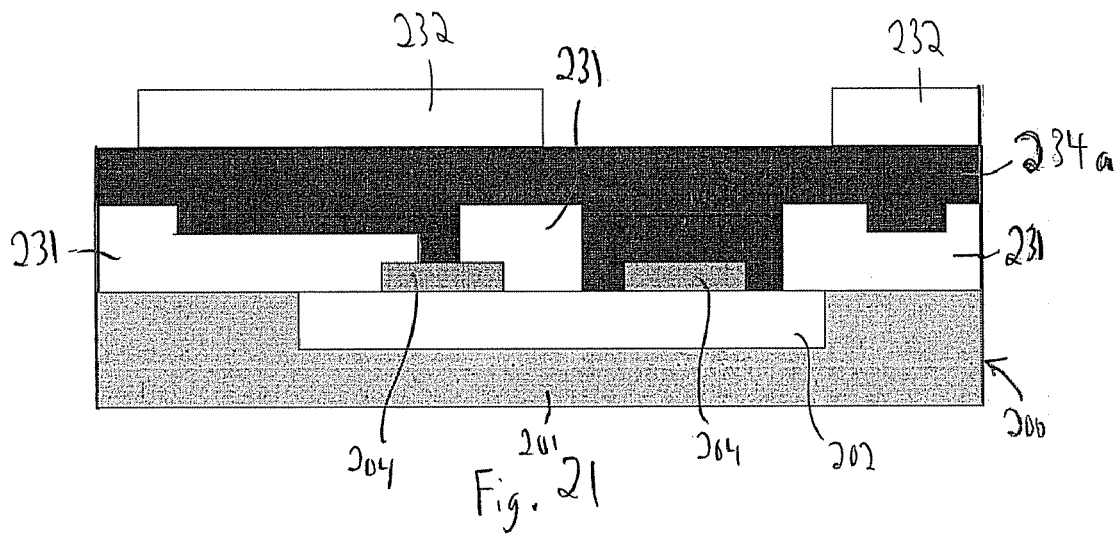
FIG. 21 illustrates a cross-sectional view of one embodiment of the embedded device, the structured dielectric layer, the conductive layer, and a mask.

FIG. 21 illustrates a cross-sectional view of one embodiment of embedded device 200, structured dielectric layer 231, conductive layer 234a, and a mask 232. Mask 232 is provided over a portion of conductive layer 234a. Mask 232 includes a spin on or a dry film resist or another suitable mask material. In one embodiment, mask 232 is formed by applying a layer of resist over conductive layer 234a using spray on or spin on and then patterning and etching the resist to provide mask 232. In another embodiment, mask 232 is printed on conductive layer 234a. In other embodiments, another suitable process is used to provide mask 232.

Figure 22:
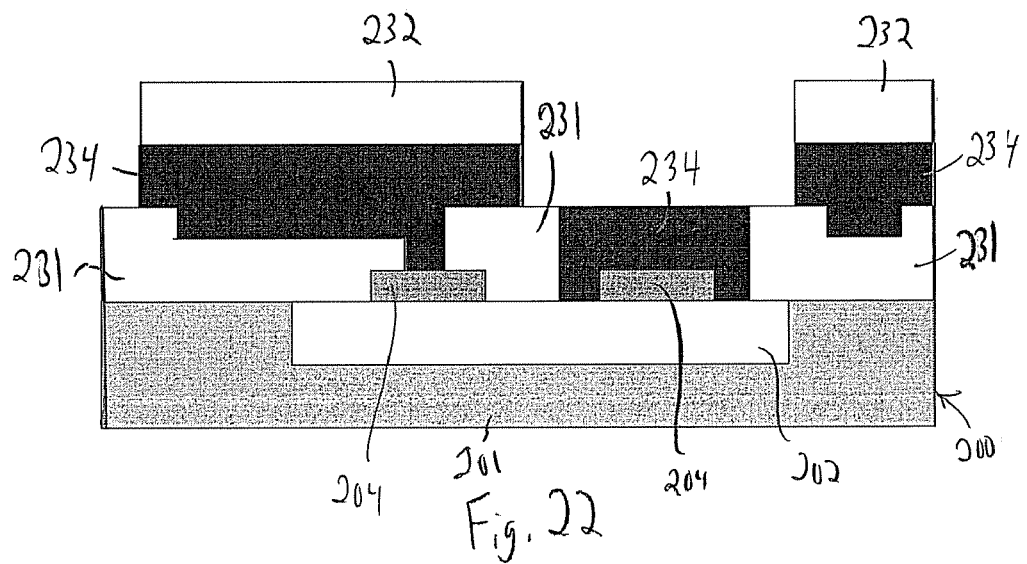
FIG. 22 illustrates a cross-sectional view of one embodiment of the embedded device, the structured dielectric layer, conductive elements, and the mask.

FIG. 22 illustrates a cross-sectional view of one embodiment of embedded device 200, structured dielectric layer 231, conductive elements 234, and mask 232. The exposed portions of conductive layer 234a are back etched to expose portions of the top of structured dielectric layer 231 to provide conductive elements 234. At least one conductive element 234 contacts a contact element 204. In one embodiment, at least one conductive element 234 does not contact a contact element 204.

The masked portions of conductive layer 234a provide a conductive element 234 including a first portion and a second portion. The first portion of the conductive element 234 is embedded in structured dielectric layer 231 while the second portion of the conductive element 234 contacts a portion of the top of structured dielectric layer 231 and extends over the first portion.

Figure 23:
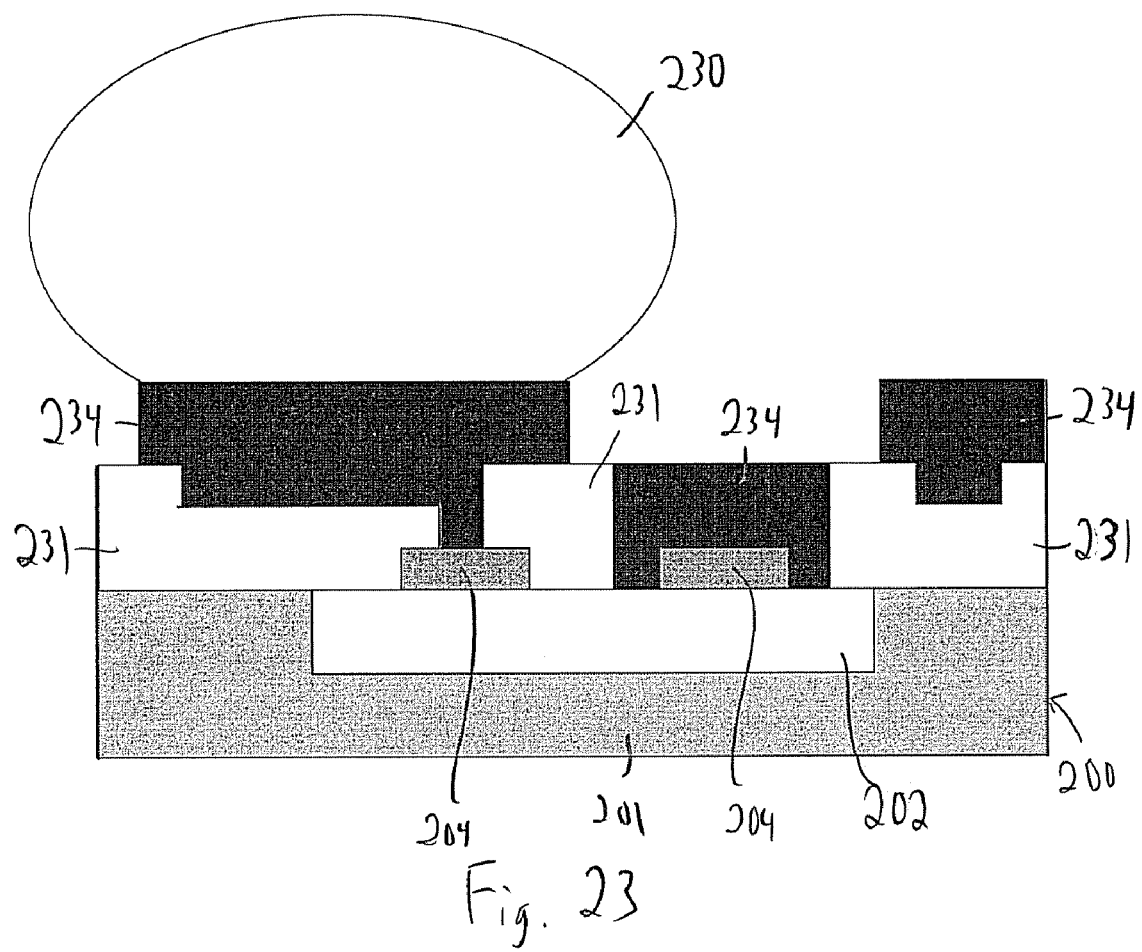
FIG. 23 illustrates a cross-sectional view of one embodiment of the embedded device, the structured dielectric layer, conductive elements, and an external contact element.

FIG. 23 illustrates a cross-sectional view of one embodiment of embedded device 200, structured dielectric layer 231, conductive elements 234, and an external contact element 230. An external contact element, such as a solder ball or another suitable external contact element is attached to a conductive element 234. In one embodiment, a solder stop layer (not shown) is applied over structured dielectric layer 231 and conductive elements 234. The solder stop layer includes at least one opening for attaching external contact element 230 to a conductive element 234.

Figure 24A:
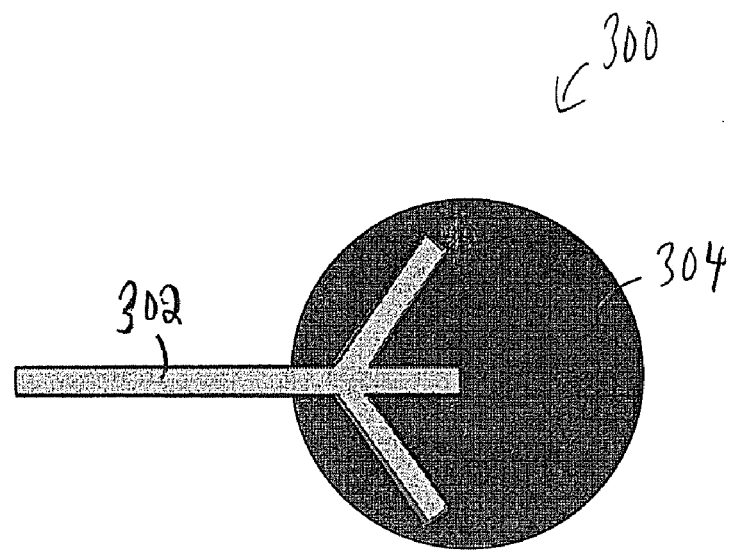
FIG. 24A illustrates a bottom view of one embodiment of a conductive element.
Figure 24B:
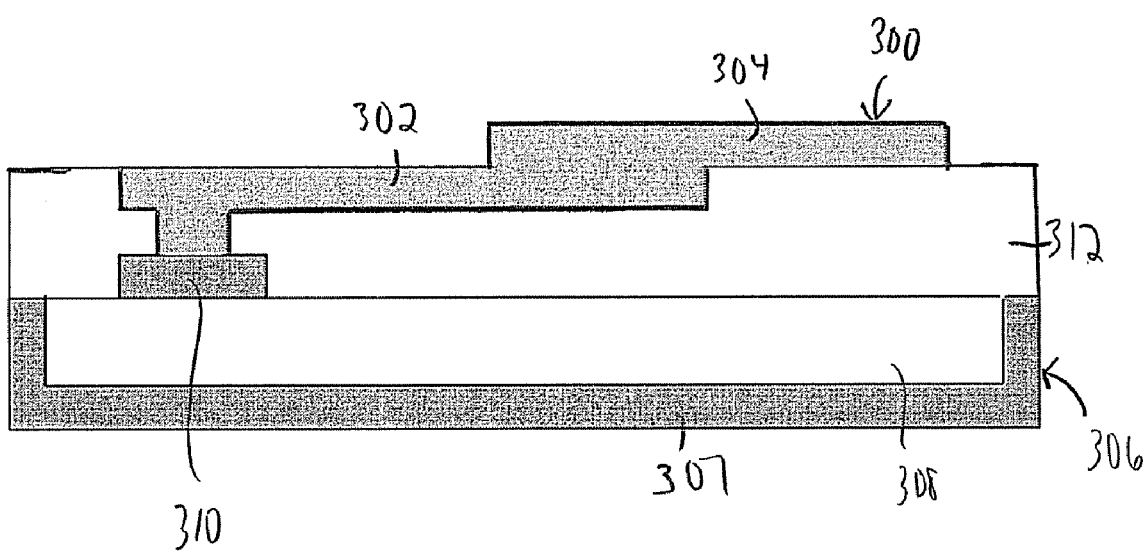
FIG. 24B illustrates a cross-sectional view of one embodiment of the conductive element illustrated in FIG. 24A.

FIG. 24A illustrates a bottom view of one embodiment of a conductive element 300 and FIG. 24B illustrates a cross-sectional view of one embodiment of conductive element 300 illustrated in FIG. 24A. Conductive element 300 is formed in and over a structured dielectric layer 312, which is over an embedded device 306. Embedded device 306 includes encapsulation material 307, a chip 308, and a contact element 310. Contact element 310 is electrically coupled to conductive element 300. In one embodiment, conductive element 300 also extends over encapsulation material 307.

Conductive element 300 includes a first portion 302 embedded in structured dielectric layer 312 and a second portion 304 that contacts the top of structured dielectric layer 312 and extends over at least a portion of first portion 302. First portion 302 includes at least two intersecting lines extending below second portion 304. In another embodiment, first portion 302 is arranged in a grid-like structure. First portion 302 electrically couples contact element 310 to second portion 304. In one embodiment, second portion 304 provides a solder ball pad for attaching a solder ball or another suitable external contact element. In one embodiment, conductive element 300 is fabricated using a process similar to the process previously described and illustrated with reference to FIGS. 20-22.

Conductive element 300 provides the benefits of relatively small conductive structures in structured dielectric layer 312 combined with a larger structure over structured dielectric layer 312. The first portion 302 below second portion 304 improves the adhesion of conductive element 300 to structured dielectric layer 312, thereby enhancing reliability. In addition, since the relatively larger second portion 304 is over structured dielectric layer 312 thereby increasing the distance between the active surface of chip 308 and second portion 304, coupling effects such as electrical parasitics are reduced.

Figure 25A:
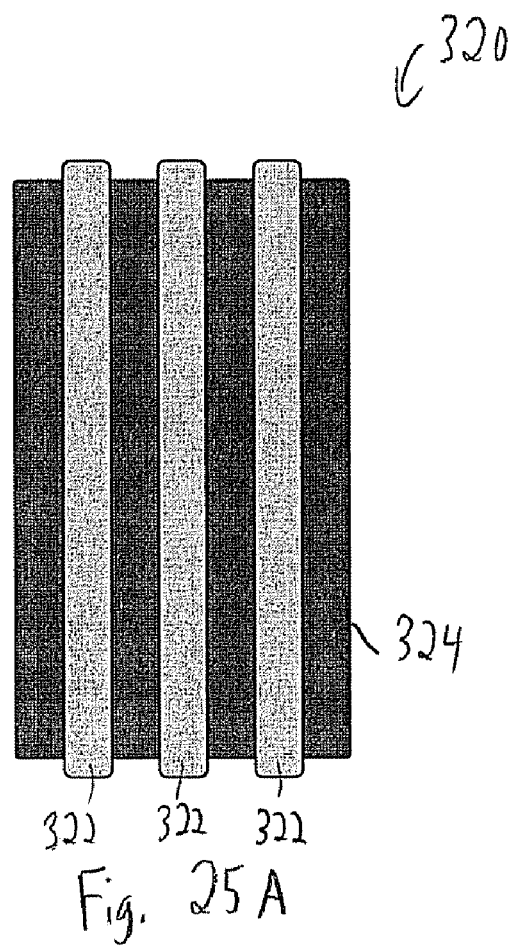
FIG. 25A illustrates a bottom view of another embodiment of a conductive element.
Figure 25B:
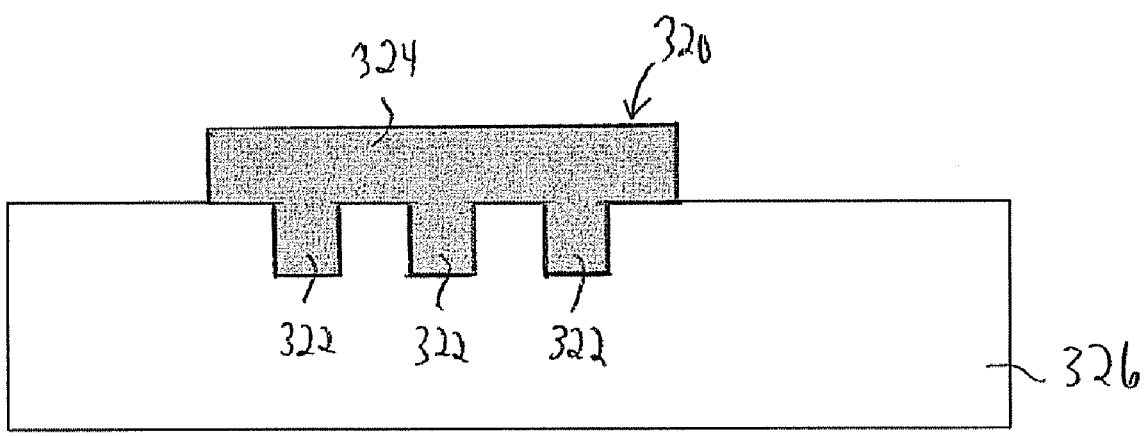
FIG. 25B illustrates a cross-sectional view of one embodiment of the conductive element illustrated in FIG. 25A.

FIG. 25A illustrates a bottom view of another embodiment of a conductive element 320. FIG. 25B illustrates a cross-sectional view of one embodiment of conductive element 320 illustrated in FIG. 25A. Conductive element 320 is formed in and over a structured dielectric layer 326, which is over an embedded device or the encapsulation material (not shown). In this embodiment, conductive element 320 provides a power line or another suitable signal line over at least a portion of the embedded device and/or the encapsulation material.

Conductive element 320 includes a first portion 322 embedded in structured dielectric layer 326 and a second portion 324 that contacts the top of a portion of structured dielectric layer 326 and extends over at least a portion of first portion 322. First portion 322 includes two or more parallel lines extending below second portion 324. In another embodiment, first portion 322 includes a grid-like structure extending below second portion 324. In one embodiment, conductive element 320 is fabricated using a process similar to the process previously described and illustrated with reference to FIGS. 20-22.

The following FIGS. 26-29 illustrate another embodiment of a method for fabricating a semiconductor device including an embedded device and a conductive element. To begin, a process similar to the process previously described and illustrated with reference to FIGS. 11 and 12 is first performed to provide an embedded device and a structured dielectric layer over the embedded device.

Figure 26:
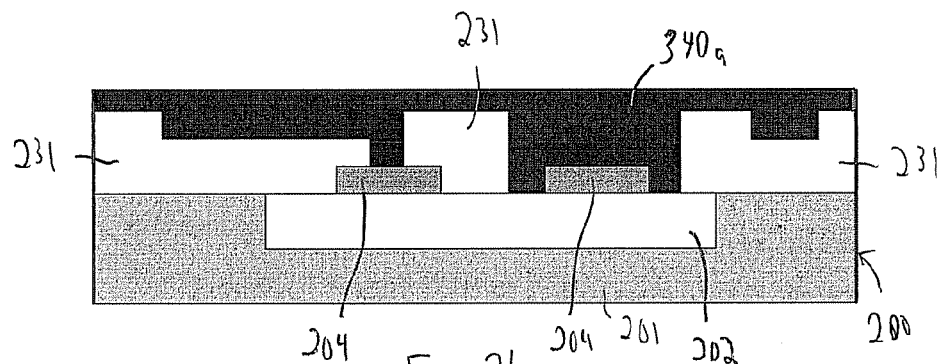
FIG. 26 illustrates a cross-sectional view of one embodiment of the embedded device, the structured dielectric layer, and a conductive layer.

FIG. 26 illustrates a cross-sectional view of one embodiment of embedded device 200, structured dielectric layer 231, and a conductive layer 340a. In this embodiment, structured dielectric layer 231 defines at least one opening that exposes a contact element 204. A conductive material, such as copper or another suitable conductive material is deposited over exposed portions of chip 202, contact elements 204, and structured dielectric layer 231 to provide conductive layer 340a. Conductive layer 340a is deposited via electroplating or another suitable deposition technique.

Figure 27:
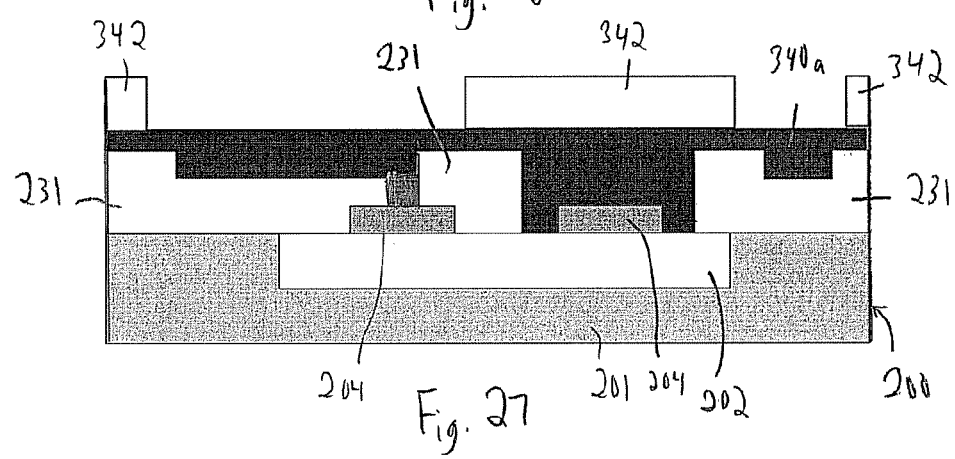
FIG. 27 illustrates a cross-sectional view of one embodiment of the embedded device, the structured dielectric layer, the conductive layer, and a mask.

FIG. 27 illustrates a cross-sectional view of one embodiment of embedded device 200, structured dielectric layer 231, conductive layer 340a, and a mask 342. Mask 342 is provided over a portion of conductive layer 340a. Mask 342 includes a spin on or a dry film resist or another suitable mask material. In one embodiment, mask 342 is formed by applying a layer of resist over conductive layer 340a using spray on or spin on and then patterning and etching the resist to provide mask 342. In another embodiment, mask 342 is printed on conductive layer 340a. In other embodiments, another suitable process is used to provide mask 342.

Figure 28:
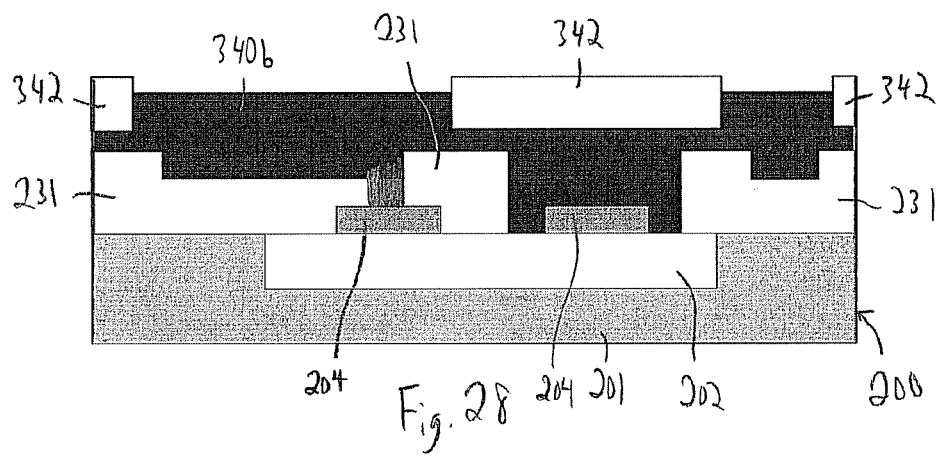
FIG. 28 illustrates a cross-sectional view of one embodiment of the embedded device, the structured dielectric layer, the conductive layer, and the mask after pattern plating.

FIG. 28 illustrates a cross-sectional view of one embodiment of embedded device 200, structured dielectric layer 231, a conductive layer 340b, and mask 342 after a pattern plating process. A conductive material, such as copper or another suitable conductive material is deposited over exposed portions of conductive layer 340a to provide conductive layer 340b, which includes conductive layer 340a. The conductive material is deposited via a pattern plating process or another suitable deposition technique.

Figure 29:
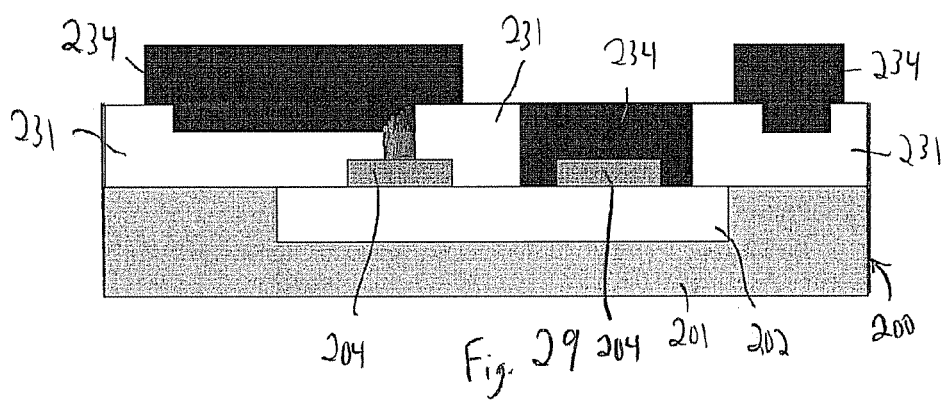
FIG. 29 illustrates a cross-sectional view of one embodiment of the embedded device, the structured dielectric layer, and conductive elements.

FIG. 29 illustrates a cross-sectional view of one embodiment of embedded device 200, structured dielectric layer 231, and conductive elements 234. Mask 342 is removed. Conductive layer 340b is then back etched to expose a portion of structured dielectric layer 231 to provide conductive elements 234 including a first portion and a second portion. The first portion of the conductive element 234 is embedded in structured dielectric layer 231 while the second portion of the conductive element 234 contacts a portion of the top of structured dielectric layer 231 and extends over the first portion.

Embodiments provide semiconductor devices including conductive elements. The conductive elements include first portions embedded in a structured dielectric layer and second portions contacting the top of the structured dielectric layer and extending over the first portions. Embodiments enable relatively large conductive structures to be formed over relatively small conductive structures using metal plating and back etching processes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a chip comprising a contact element;
a structured dielectric layer over the chip; and
a conductive element coupled to the contact element, the conductive element comprising a first portion embedded in the structured dielectric layer such that sidewalls and a bottom of the first portion directly contact the structured dielectric layer, a second portion at least partially spaced apart from the first portion and embedded in the structured dielectric layer such that sidewalls and a bottom of the second portion directly contact the structured dielectric layer, and a planar third portion contacting a top of the structured dielectric layer and extending at least vertically over the first portion and the second portion, the third portion directly contacting a top of the first portion and a top of the second portion,
wherein the first portion comprises a first line parallel to the planar third portion, and
wherein the second portion comprises a second line parallel to the planar third portion.

2. The semiconductor device of claim 1, wherein the second line is parallel to the first line.

3. The semiconductor device of claim 1, wherein the second line intersects the first line.

4. The semiconductor device of claim 3, wherein the third portion comprises an external contact element pad.

5. The semiconductor device of claim 4, further comprising:
an external contact element contacting the external contact element pad.

6. The semiconductor device of claim 5, wherein the external contact element comprises a solder ball.

7. The semiconductor device of claim 1, wherein the conductive element comprises Cu.

8. The semiconductor device of claim 1, wherein the chip is embedded in encapsulation material.

9. A semiconductor device comprising:
a chip comprising a contact element;
a first structured dielectric layer over the chip;
a first conductive element coupled to the contact element, the first conductive element embedded in the first structured dielectric layer;
a second structured dielectric layer over the first conductive element and the first structured dielectric layer; and
a second conductive element coupled to the first conductive element, the second conductive element comprising a first portion embedded in the second structured dielectric layer such that sidewalls and a bottom of the first portion directly contact the second structured dielectric layer and a planar second portion contacting a top of the second structured dielectric layer and extending at least vertically over the first portion, the second portion directly contacting a top of the first portion, wherein the first portion comprises a first line parallel to the planar second portion.

10. The semiconductor device of claim 9, wherein the second conductive element comprises a third portion embedded in the second structured dielectric layer such that sidewalls and a bottom of the third portion directly contact the second structured dielectric layer, and
wherein the second portion directly contacts a top of the third portion, and
wherein the third portion comprises a second line parallel to the planar second portion.

11. The semiconductor device of claim 10, wherein the second line is parallel to the first line.

12. The semiconductor device of claim 10, wherein the second line intersects the first line.

13. The semiconductor device of claim 12, wherein the second portion comprises an external contact element pad.

14. The semiconductor device of claim 13, further comprising:
an external contact element contacting the external contact element pad.

15. The semiconductor device of claim 14, wherein the external contact element comprises a solder ball.

16. The semiconductor device of claim 9, wherein the second conductive element comprises Cu.

17. The semiconductor device of claim 9, wherein the chip is embedded in encapsulation material.

18. A semiconductor device comprising:
a chip comprising a contact element;
a dielectric layer over the chip; and
a conductive element coupled to the contact element, the conductive element comprising a first portion having sidewalls and a bottom directly contacting the structured dielectric layer, a second portion having sidewalls and a bottom directly contacting the structured dielectric layer, and a planar third portion directly contacting a top of the structured dielectric layer, a top of the first portion, and a top of the second portion,
wherein the first portion comprises a first line parallel to the planar third portion, and
wherein the second portion comprises a second line parallel to the planar third portion.

19. The semiconductor device of claim 18, wherein the conductive element comprises a fourth portion having sidewalls and a bottom directly contacting the structured dielectric layer, and
wherein the third portion directly contacts a top of the fourth portion, and
wherein the fourth portion comprises a third line parallel to the planar third portion.

20. The semiconductor device of claim 19, wherein the second line is parallel to the first line, and the third line is parallel to the first line and the second line.

21. The semiconductor device of claim 19, wherein the first line, the second line, and the third line intersect at a common point.

* * * * *